United States Patent [19]

Kameya

[11] Patent Number: 4,829,272

[45] Date of Patent: May 9, 1989

[54] ELECTROMAGNETIC VARIABLE DELAY LINE SYSTEM

[75] Inventor: Kazuo Kameya, Tsurugashima, Japan

[73] Assignee: Elmec Corporation, Tsurugashima, Japan

[21] Appl. No.: 204,747

[22] Filed: Jun. 10, 1988

[30] Foreign Application Priority Data

Jun. 10, 1987 [JP] Japan ............................... 62-144739
Jun. 19, 1987 [JP] Japan ............................... 62-152525

[51] Int. Cl.$^4$ ..................... H03H 7/32; H03H 7/20
[52] U.S. Cl. ..................................... 333/139; 333/23; 333/138
[58] Field of Search ............... 333/138, 139, 140, 164, 333/23, 32, 17 M; 328/65

[56] References Cited

U.S. PATENT DOCUMENTS

4,594,557  6/1986  Shillady ........................... 333/23 X

FOREIGN PATENT DOCUMENTS

842437  7/1960  United Kingdom ................ 333/139

*Primary Examiner*—Marvin L. Nussbaum
*Attorney, Agent, or Firm*—Wegner & Bretschneider

[57] ABSTRACT

An electromagnetic variable delay line system in which the change in the output impedance of the delay line as its delay time is varied is compensated by an electronic device such as a field effect transistor which is connected across the output end of the variable delay line system. Therefore, generation of undesirable reflected waves can be prevented and high speed signals can be processed without distorting the signals.

9 Claims, 6 Drawing Sheets

ELECTROMAGNETIC VARIABLE DELAY LINE SYSTEM

TECHNICAL FIELD

The present invention relates to an electromagnetic variable delay line system and in particular to an improved electromagnetic variable delay line whose delay time can be varied with a control signal.

BACKGROUND OF THE INVENTION

A conventional variable delay line DL typically comprises an inductance element L consisting of a solenoid and provided with a plurality of taps as shown in FIG. 14. These taps are connected to the cathodes of variable capacitance diodes Dv whose anodes are grounded by way of a bypass capacitor Cp. The output end of the delay line DL is connected to a terminal resistor RL. An analog control voltage Vd (reverse voltage) generated by a D/A converter DAC having input terminals $D_0$ through $D_{n-1}$ for an n-bit digital signal is supplied to the anodes of the variable capacitance diodes Dv. The D/A converter DAC produces an analog control signal according to the bit structure of the signal provided to its input terminals.

The input end and the output end of the delay line DL are typically connected to an input terminal 1 and an output terminal 3 by way of respective buffer circuits which may consist of inverters I.

In this variable delay line DL, as the bit structure of the digital control signal is varied, the analog control signal accordingly changes and so does the delay time of the delay line DL. Thus, a variable delay line of this type can be used as a programmable delay line.

This delay line has the advantage that the structure is simple and the delay time can be electronically varied in very small steps, but has some shortcomings as described in the following.

The graph in FIG. 15 shows the change in the characteristic impedance $Z_0$ and the delay time $t_d$ of the delay line DL in relation with the control voltage Vd. It can be seen that the characteristic impedance $Z_0$ and the delay time $t_d$ of the delay line DL change in opposite directions and in nonlinear fashion as the control voltage Vd is varied. Therefore, impedance matching between the delay line DL and the terminal resistor RL is possible only at one point in the whole variable range of the variable delay line DL and the state of impedance mismatching is therefore present in most of the variable range of the variable delay line DL. Therefore, an input signal produces reflected waves in the variable delay line in most part of the variable range of the variable delay line DL. Particularly when a high speed signal is supplied to the variable delay line DL, the reflected waves tend to distort the output signal.

BRIEF SUMMARY OF THE INVENTION

In view of such problems of the prior art, a primary object of the present invention is to provide an electromagnetic variable delay line system which can achieve an impedance matching at its output end in a wide variable range of delay time.

A second object of the present invention is to provide an electromagnetic variable delay line system which would not distort high speed output signals.

A third object of the present invention is to provide an electromagnetic variable delay line system which can vary its delay time in a linear fashion and can accomplish an impedance matching in all part of the variable range of delay time.

A fourth object of the present invention is to provide an electromagnetic variable delay line system which is simple in structure and economical to manufacture.

These and other objects of the present invention can be accomplished by providing an electromagnetic variable delay line system, comprising: a delay line consisting of an inductance element having a plurality of taps to which variable capacitance diodes are connected in a ladder; a signal source for changing a delay time of the delay line by supplying a first control signal to the variable capacitance diodes; electronic impedance varying means which is connected across an output end of the delay line and is adapted to change its impedance in a nonlinear fashion; and a nonlinear circuit for producing a second control signal from the first control signal for changing the impedance of the electronic impedance varying means according to the change in a characteristic impedance of the delay line.

Thus, the characteristic impedance of the delay line changes in a nonlinear fashion as the first control voltage is varied for the purpose of varying the delay time of the delay line, but, since the impedance of the electronic impedance varying means which may consist of a field effect transistor (FET) is likewise varied by the second control voltage, an impedance matching can be accomplished in the entire variable range of delay time of the delay line system through the use of a single signal source.

According to a preferred embodiment of the present invention, the first control signal changes in a nonlinear fashion so that a linear variation of delay time may be possible.

According to another preferred embodiment of the present invention, the electronic impedance varying means is connected in parallel with a fixed resistor across an output end of the delay line. Thus, the impedance value obtained by varying the second control signal applied to the electronic impedance varying means can be varied from a lower value than otherwise. Alternatively, the electronic impedance varying means may be connected in series with a fixed resistor across an output end of the delay line. This permits the composite impedance to range to a higher value than otherwise. The latter structure is particularly suited for application where the signal amplitude value could be so large that it exceeds the input voltage permitted to the electronic impedance varying means such as an FET as is the case of a TTL circuit which involves a large amplitude signal than an ECL circuit. Generally, when the amplitude of the input voltage of a delay line is large, the characteristic impedance thereof is selected to be relatively high. In such a case, if a large part of the output voltage is developed across the terminal resistor RL and only the variational component of the output voltage is applied across the FET, then the voltage across the FET may be lower than otherwise and the need for a specialized high-voltage FET can be avoided.

According to a certain preferred embodiment of the present invention, there is provided an electromagnetic variable delay line system, comprising: a delay line consisting of an inductance element having a plurality of taps to which variable capacitance diodes are connected in a ladder; a signal source for changing a delay time of the delay line by supplying a first control signal to the variable capacitance diodes; electronic impedance varying means which is connected across an output end of the delay line; a terminal resistor connected in parallel with the electronic impedance varying means across an output end of the delay line; and a linear circuit for producing a second control signal from the first control signal in a linear fashion for changing the impedance of the electronic impedance varying means according to the change in a characteristic impedance of the delay line; a resistive value of the terminal resistor being selected in such a manner that a change in a composite impedance of the electronic impedance varying means and the terminal resistor is adapted to a change in the characteristic impedance of the delay line.

According to this embodiment, the need for a nonlinear circuit is eliminated and the delay line system is made simpler and more economical to manufacture.

BRIEF DESCRIPTION OF THE DRAWINGS

Now the present invention is described in the following with reference to the appended drawings, in which.

DETAILED DESCRIPTION OF THE PREFERRED EMBODIMENTS

First Embodiment

Figure 1:
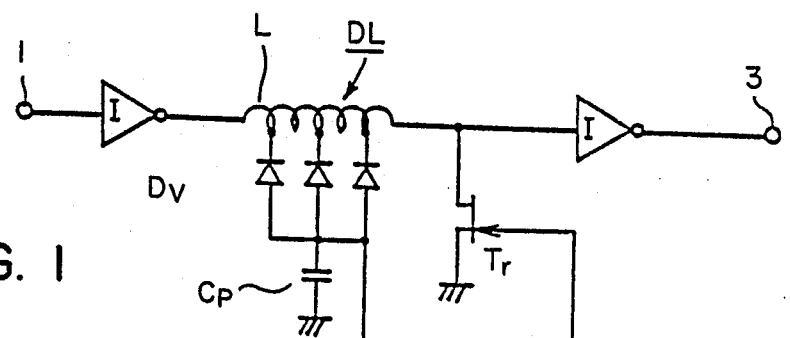
FIG. 1 is a circuit diagram of a first embodiment of the electromagnetic variable delay line according to the present invention.

In FIG. 1, an inverter I, a delay line DL and another inverter I are connected in series between an input terminal 1 and an output terminal 3. The delay line DL comprises an inductance element L having a single-layer solenoid of electroconductive wire wound around a rod-shaped bobbin, a plurality of variable capacitance diodes Dv having their cathodes connected to intermediate taps of the inductance element L in a ladder, and a bypass capacitor Cp which ground the common anode ends of the variable capacitance diodes Dv. The output end of the delay line is connected to the drain of a field effect transistor (FET) Tr whose source is grounded. This FET Tr may be replaced with any electronic device which can electronically vary its impedance.

The common anodes of the variable capacitance diode Dv is connected to an output of a D/A converter DAC serving as a signal source. This D/A converter DAC is provided with a plurality of input terminals $D_0$ through $D_{n-1}$ for receiving an n-bit digital signal. When a digital signal of a certain bit structure is applied to the input terminals $D_0$ through $D_{n-1}$, a first control voltage Vd consisting of a corresponding reverse (negative) analog voltage is produced at the output end of the D/A converter DAC.

The D/A converter DAC is also connected to the gate of the FET Tr by way of a first nonlinear circuit 5. This first nonlinear circuit 5 receives the first control voltage Vd and produces a second control signal Vg for varying the impedance between the drain and the source of the FET Tr in a nonlinear fashion in the same way as the characteristic impedance of the delay line DL.

Figure 2:
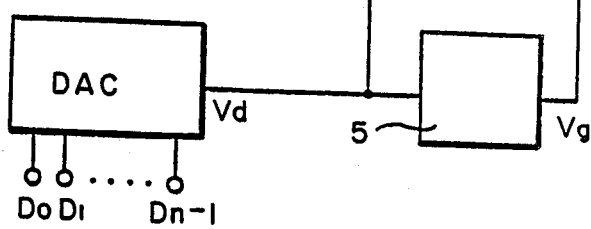
FIG. 2 is a circuit diagram of an embodiment of the first nonlinear circuit shown in FIG. 1.

FIG. 2 shows a concrete example of the first nonlinear circuit 5 which is based on a piece-wise linear approximation.

An input terminal 7 of this nonlinear circuit 5 is connected to a non-inverting input of an operational amplifier 9 b way of a resistor Rs and is grounded by way of a resistor R1. The non-inverting input of the operational amplifier 9 is further connected to the cathodes of diodes Da and Db by way of resistors R2 and R3, respectively. Resistors Ra, Rb and Rc are connected in that order across a power source E having its positive end grounded. The resistor Ra is located on the ground end of this serial connection. The anodes of the diodes Da and Db are connected to the node between the resistors Ra and Rb and the node between the resistors Rb and Rc, respectively. The resistors Ra, Rb and Rc determine the voltages of the cathodes of the diodes Da and Db and are provided with resistive values which are sufficiently lower than those of the resistors R1, R2 and R3.

The output end of the operational amplifier 9 is connected to an output terminal 11 of the nonlinear circuit 5 and is grounded by way of resistors R4 and R5. The node between the resistors R4 and R5 is connected to the inverting input of the operational amplifier 9. These resistors R4 and R5 are feedback resistors which determine the gain of the first nonlinear circuit 5.

Figure 3:
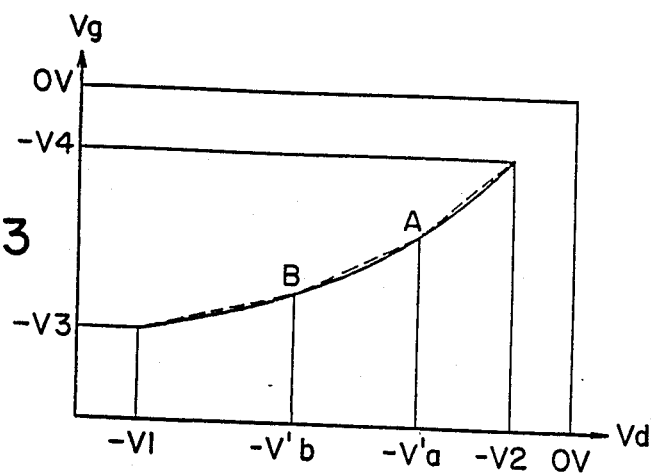
FIG. 3 is a characteristic curve of the first nonlinear circuit shown in FIG. 2.

In the first nonlinear circuit 5, if the range of the first control voltage or the input voltage Vd is from $-V1$ to $-V2$, the second control voltage or the output voltage Vg then ranges from $-V3$ to $-V4$ and changes between these limit values in a nonlinear fashion as shown by the broken line of the graph given in FIG. 3. The solid line in FIG. 3 represents an ideal property.

Suppose that the second control voltage Vg is $-V3$ when the first control voltage is $-V1$. At this time, the non-inverting input terminal of the operational amplifier 9 is more negative than the voltages $-Va$ or $-Vb$ (where $-Va$ is the voltage of the node between resistors Ra and Rb and $-Vb$ is the voltage of the node between the resistors Rb and Rc) and the diodes Da and Db are thereby turned into conductive states so that the resistors R2 and R3 are connected in parallel with the resistor R1. In this state, since the first control voltage $-V1$ is divided by the ratio of the composite resistive value of the resistors R1, R2 and R3 to the resistor Rs, the gain from the input terminal 7 to the output terminal 11 takes a smallest possible value.

As the first control voltage $-V1$ is increased from $-V1$ towards zero, the second control voltage likewise increases from $-V3$ toward zero but, since the gain of the nonlinear circuit 5 is small, increases towards a point B along a least steep slope denoted by the broken line.

As the first control voltage Vd reaches $-Vb'$, the input voltage of the non-inverting input of the operational amplifier 9 becomes $-Vb-Vf$ (where Vf is a forward voltage drop across the diodes Da and Db). Once the first control voltage Vd exceeds $-Vb'$, the diode Db becomes non-conductive and, since the resistor R2 is now connected in parallel with the resistor R1, the gain of the first nonlinear circuit 5 increases as denoted by a slope from the point B to a point A in FIG. 3.

As the first control voltage Vd reaches $-Va'$, the input voltage of the non-inverting input of the operational amplifier 9 becomes $-Va-Vf$. Once the first control voltage Vd exceeds $-Va'$, the diode Da becomes non-conductive in addition to the diode Db and the gain of the first nonlinear circuit 5 increases further as denoted by a slope extending upward from the point A in FIG. 3.

Thus, the first nonlinear circuit 5 will ultimately demonstrate a property denoted by a broken line which is a good approximation of the ideal property denoted by a solid line.

If it is required to shift the relative DC levels of the first control voltage Vd and the second control voltage Vg, a certain DC voltage may be applied to the inverting input of the operational amplifier 9.

Figure 15:
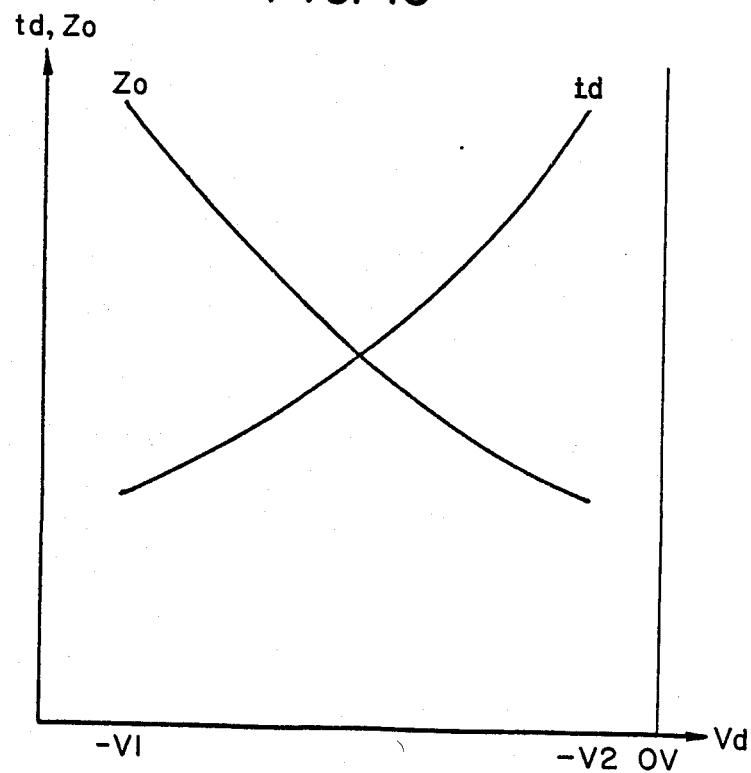
FIG. 15 is typical property curves of a conventional delay line using variable capacitance diodes.

As the bit structure of the digital control signal applied to the input terminals $D_0$ through $D_{n-1}$ of the D/A converter DAC is varied, the first control voltage Vd accordingly changes thereby causing changes in the capacitive values of the variable capacitance diodes Dv. As a result, the delay time $t_d$ and the characteristic impedance $Z_0$ of the delay line change as shown in FIG. 15.

The first control voltage Vd is also applied to the first nonlinear circuit 5. Since the first nonlinear circuit 5 is so constructed that the impedance of the FET Tr changes in a nonlinear fashion following the change in the characteristic impedance of the delay line DL, an impedance matching can be maintained throughout the whole variable range of the delay time $Z_0$ of the delay line DL. Thus, since the delay time can be varied with a single control signal while an impedance matching is maintained all the time, no reflected wave will be produced in the delay line DL and distortion of high speed signals can be avoided.

The first nonlinear circuit 5 described above is not limited to the one based on piece-wise linear approximation, but may also consist of the one which is based on the nonlinear property of the forward current for a given voltage applied across a PN junction.

Second Embodiment

Figure 4:
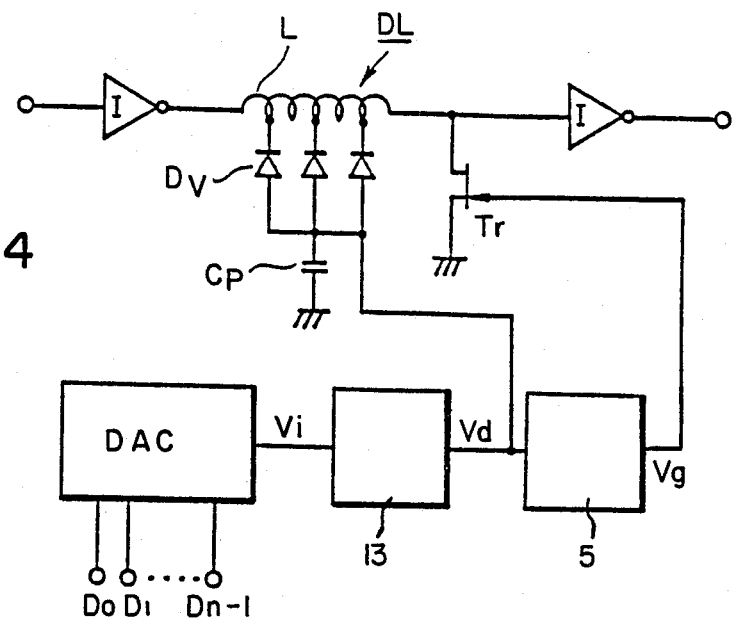
FIG. 4 is a circuit diagram showing a second embodiment of the present invention.

In FIG. 4, the anodes of variable capacitance diodes Dv of a variable delay line DL similar to that of FIG. 1 are connected to an output of a D/A converter DAC by way of a second nonlinear circuit 13. Thus, in this embodiment, the D/A converter DAC and the second nonlinear circuit 13 jointly constitute a signal source. The second nonlinear circuit 13 receives an output voltage Vi and converts it into a first control voltage Vd which has an opposite nonlinearity to that of the delay property of the variable capacitance diodes Dv in relation with its control voltage.

Generally, a variable capacitance diode Dv demonstrates such a nonlinearity that a small capacitance change occurs for a given change in the (reverse) control voltage if the control voltage is relatively high and a large capacitance change occurs for a given change in the (reverse) control voltage if the control voltage is relatively low. Therefore, the second nonlinear circuit 13 produces a first control voltage Vd which changes much when the input voltage Vi is low (when the inverse voltage is high) and changes little when the input voltage Vi is high (when the inverse voltage is low).

Figure 5:
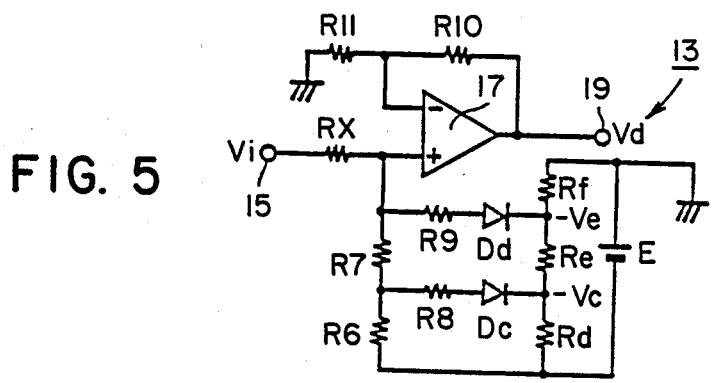
FIGS. 5 and 6 are a circuit diagram and a characteristic curve of the second nonlinear circuit shown in FIG. 4.

FIG. 5 shows a concrete example of the second nonlinear circuit 13 which is based on piece-wise linear approximation. The input terminal 15 of this circuit is connected to the non-inverting input of an operational amplifier 17 by way of a resistor Rx and is also connected to a negative voltage source E by way of resistors R7 and R6. The two ends of the resistor R7 are connected to the anodes of diodes Dc and Db by way of resistors R8 and R9, respectively. To the negative voltage source E are connected resistors Rd, Re and Rf in series, and the cathodes of the diodes Dc and Dd are connected to the node between the resistors Rd and Re and the node between the resistors Re and Rf, respectively. The resistors Rd, Re and Rf determine the cathode voltages of the diodes Dc and Dd and the resistors Rd and Re are provided with resistive values which are sufficiently lower than those of the resistors R8 and R9. The output end of the operational amplifier 17 is connected to the output terminal 19 of the nonlinear circuit 13 and is grounded by way of resistors R10 and R11. The node between the resistors R10 and R11 is connected to the inverting input of the operational amplifier 17.

Figure 6:
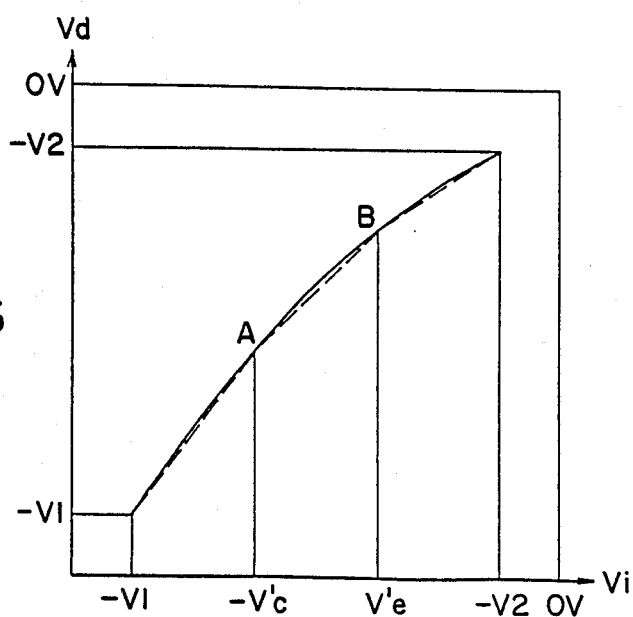

In the second nonlinear circuit 13, if the range of the first control voltage or the input voltage Vd from the D/A converter DAC is from $-V1$ to $-V2$, the output voltage likewise ranges from $-V1$ to $-V2$ and changes between these limit values in a nonlinear fashion as shown by the broken line in FIG. 6. The solid line in FIG. 6 represents an ideal property.

As the input voltage Vi increases from $-V1$ toward zero, the output voltage Vd likewise increases from $-V1$ toward zero and follows a first slope drawn to a point A until the input voltage Vi reaches the value of $-Vc'$. Since it is so arranged that the voltage of the node between the resistors R6 and R7 is equal to $-Vc+Vf$ (where Vf is the forward voltage drop of the diodes Dc an Dd) when the input voltage is $-Vc'$, the diodes Da and Db stay in their non-conductive states as long as the input voltage Vi is lower than $-Vc'$. Therefore, the voltage divided from the input voltage Vi by the resistors Rx, R6 and R7 is applied to the non-inverting input of the operational amplifier 17 and a highest possible gain is obtained as represented by the first slope extending upward to the point A. The gain can be adjusted by appropriate selection of the feedback resistors R10 and R11.

When the input voltage Vi has reached $-Vc'$, the diode Dc goes into a conductive state and the resistor R6 is connected in parallel with the resistor R8 with the result that the voltage applied to the operational amplifier 17 is reduced in its relation with the input voltage Vi as represented by the second slope extending between the point A and a point B.

When the input voltage Vi has reached $-Ve'$, since it is so arranged that the voltage of the node between the resistors Rx and R7 is equal to $-Ve+Vf$, the diode Dd becomes conductive. As a result, the resistor R9 is also connected in parallel with the combination of the resistors R6, R8 and R7. Thus, the input to the operational amplifier 17 in relation with the input voltage is reduced and the gain of the circuit takes a smallest possible value as represented by the third slope extending upward from the point B. Thus, this nonlinear circuit 13 is also based on piece-wise linear approximation.

As described above, in the delay line DL illustrated in FIG. 4, the change in the capacitance of each of the variable capacitance diodes Dv for a given change in the first control voltage Vd is small when the first control voltage is low and is large when the first control voltage is high. However, the first control voltage Vd applied to the variable capacitance diodes Dv undergoes a large change when the input voltage from the D/A converter DAC is low, and a small change when the input voltage from the D/A converter DAC is high. Therefore, as an overall effect, the delay time of the delay line DL changes in a linear fashion according to the change in the digital control signal.

The first control voltage was obtained from the second nonlinear circuit 13 in the second embodiment, but the first nonlinear circuit 5 can be used either with or without the second nonlinear circuit 13. The nonlinear circuit 13 of FIG. 5 is not required to be based on piece-wise linear approximation.

Third Embodiment

Figure 7:
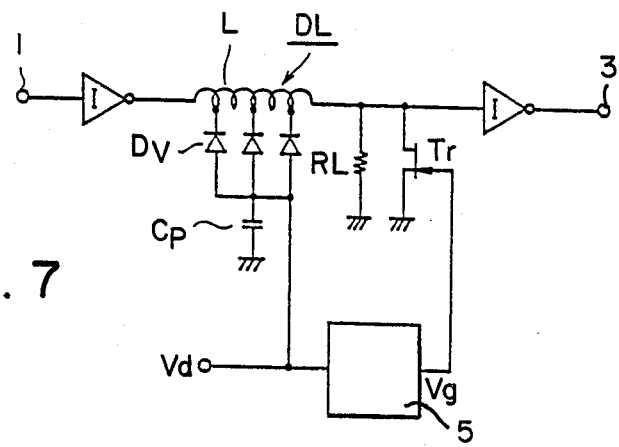
FIGS. 7 through 9 are circuit diagrams showing a third, a fourth and a fifth embodiment of the present invention, respectively.

In this embodiment, an FET Tr and a fixed terminal resistor RL are connected in parallel across the output end of the delay line DL as shown in FIG. 7. In this embodiment, since the composite resistive value of the parallel connection of the FET Tr and the terminal resistor RL is smaller than the resistive value of either one of them, the impedance value obtained by varying the second control signal Vg applied to the FET Tr can be varied from a lower value than the preceding embodiments.

Fourth Embodiment

Figure 8:
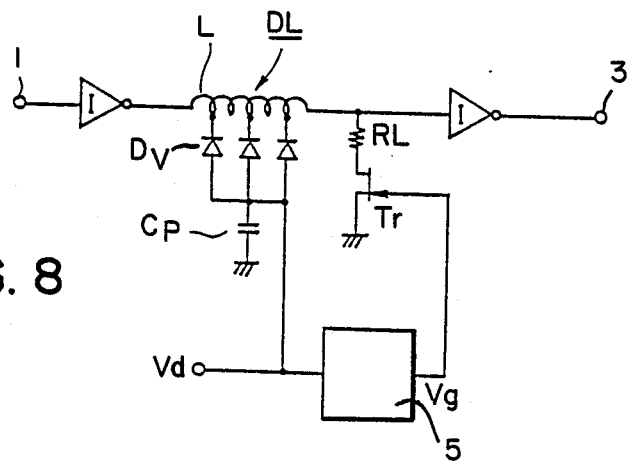

In this embodiment, an FET Tr and a fixed terminal resistor RL are connected in series across the output end of the delay line DL as shown in FIG. 8. This permits the composite impedance to range to a higher value than the preceding embodiments.

This structure is suited for application where the signal amplitude value could be so large that it exceeds the voltage permitted across the drain and the source of the FET Tr serving as a variable impedance element as is the case of a TTL circuit which involves a large amplitude signal than an ECL circuit. Generally, when the amplitude of the input voltage of a delay line is large, the characteristic impedance thereof is selected to be relatively high. In such a case, if a large part of the output voltage is developed across the terminal resistor RL and only the variational component of the output voltage is applied across the FET Tr, then the voltage across the FET may be lower than otherwise and the need for a specialized high-voltage FET can be avoided.

Fifth Embodiment

Figure 9:
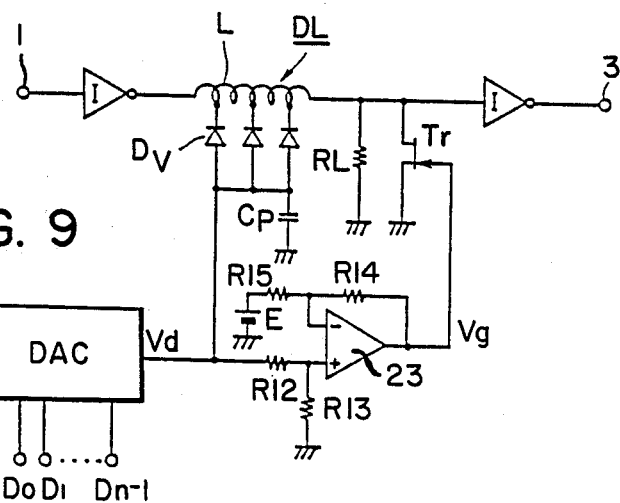

In FIG. 9, an inverter I, an inductance element L, an FET Tr, another inverter I and a D/A converter DAC are connected in the same fashion as the first embodiment, and the FET Tr and a terminal resistor RL are connected in parallel across the output end of the delay line DL.

The output of the D/A converter DAC is connected to the anodes of the variable capacitance diodes Dv of the delay line DL and also to the gate of the FET Tr by way of a linear circuit 21. The linear circuit 21 produces a second control signal Vg which is linearly proportional to a first control voltage Vd. This linear circuit 21 comprises an operational amplifier 23, and a resistor R12 connecting the output of the D/A converter DAC to the non-inverting input of the operational amplifier 23, a resistor R13 grounding the non-inverting input of the operational amplifier 23, a feedback resistor R14 connected across the output and the inverting input of the operational amplifier 23, and a resistor R15 connecting the inverting input of the operational amplifier 23 to a positive voltage source E whose negative end is grounded. The resistors R12 and R13 divide the first control voltage Vd obtained from the output of the D/A converter DAC while the resistors R14 and R15 determine the gain of the linear circuit 21. The voltage source E is provided for shifting the DC level of the signal.

Now the action of the fifth embodiment is discussed in the following.

Figure 10:
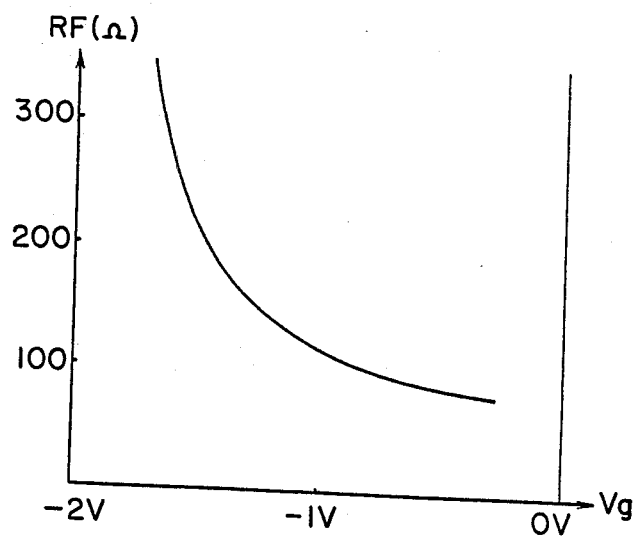
FIG. 10 is a graph showing the impedance property of the FET used in the fifth embodiment.

Generally, a FET Tr for handling small signals is suitable for use as a variable impedance element when the voltage applied across the drain and the source of the FET Tr is less than 1.5 volt, and the resistance $R_F$ between the drain and the source is related to the gate voltage Vg (the second control voltage) typically as given in the graph of FIG. 10. As can be seen from this graph, as the gate voltage Vg is decreased to a further negative level, the resistance $R_F$ in relation with the gate voltage Vg sharply and nonlinearly increases and eventually rises to an infinite level when the FET Tr is finally brought into a non-conductive state. This range of variation is far greater than that of the characteristic impedance $Z_0$ of a conventional delay line DL using variable capacitance diodes Dv. Therefore, for the reason described above, it is possible to accomplish an impedance matching over the whole range of the variation of the delay time according to this embodiment.

Figure 11:
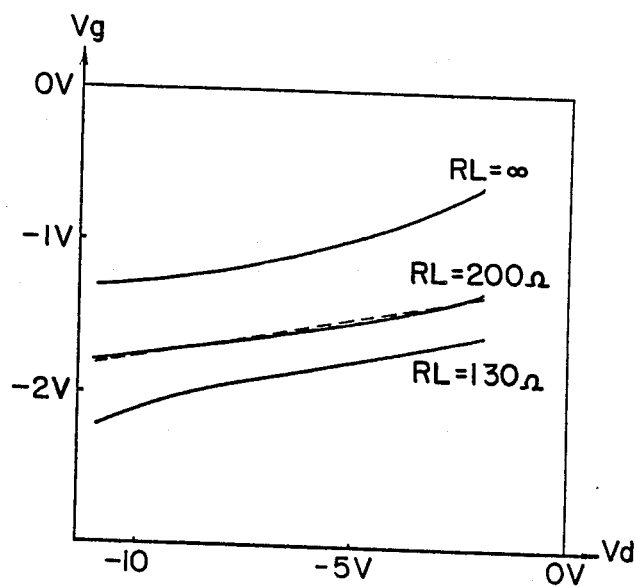
FIG. 11 shows the relationship between the first control signal and the second control signal for matching the composite impedance of the terminal resistor and the FET with the characteristic impedance of the delay line as the resistive value of the terminal resistor is varied.

In the variable delay line shown in FIG. 9, if an FET Tr having the property shown in FIG. 10 is combined with a delay line DL, by setting the relationship between the first control voltage Vd and the second control voltage Vg as represented by the solid characteristic curve shown in FIG. 11, the composite impedance of the terminal resistor RL and the FET Tr can be matched with the characteristic impedance $Z_0$ of the delay line DL as the resistive value of the terminal resistor RL is varied from infinity to 200 ohms and 130 ohms. According to the characteristic curve of FIG. 11, since the curve is curved (or not straight) throughout its entire range if there is no terminal resistor RL or if the resistive value of the terminal resistor RL is infinite, the second control voltage Vg is required to be derived by nonlinearly varying the first control voltage Vd.

If the resistive value of the terminal resistor RL is 130 ohms, the characteristic impedance of the delay line DL is substantially linear when the first control voltage Vd is close to zero but becomes fairly nonlinear when the first control voltage Vd is close to $-10$ V.

It was found that the characteristic impedance $z_0$ of the delay line DL is substantially linear when the terminal resistor is 200 ohms and that, therefore, substantially no mismatching occurs when the characteristic impedance is approximated with a linear property as represented by a broken line. Therefore, it suffices if the linear circuit 21 which is described above is provided with a linear property as represented by a broken line in FIG. 11.

The resistive value of the terminal resistor RL which permits the relationship between the first control voltage Vd and the second control voltage Vg to be substantially linear in this way is dependent on the properties of the variable capacitance diodes Dv and the inductance element L of the delay line DL, but it was found that the trend represented by the graph in FIG. 11 is generally present.

Therefore, in the fifth embodiment, if the second control voltage Vg varying in a linear fashion is applied to the FET Tr and the terminal resistor RL is so selected that the composite impedance of the terminal resistor RL and the FET Tr approximately follows the characteristic impedance $Z_0$ of the delay line DL, it is possible to obtain an impedance matching throughout the entire variable range of delay time even when the impedance of the FET Tr is varied by the linear circuit 21 instead of the first nonlinear circuit.

Therefore, the capability of the delay line DL to handle high speed signals is improved through suppression of reflected waves and the circuit structure is made both simple and economical because a simple linear circuit can be used to obtain the second control voltage Vg from the first control voltage Vd.

Sixth Embodiment

Figure 12:
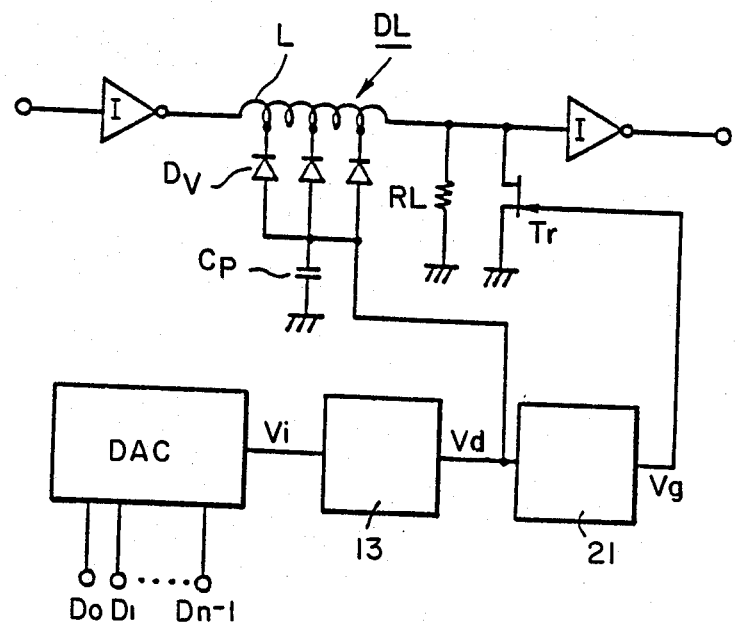
FIGS. 12 and 13 show a sixth and a seventh embodiment of the present invention, respectively.

In the delay line DL shown in FIG. 12, a D/A converter DAC is connected to the anodes of the variable capacitance diodes Dv and to a linear circuit 21 by way of a nonlinear circuit 13. This embodiment is a combination of the embodiments illustrated in FIGS. 4 and 9. In this delay line DL, the delay time is varied linearly with the change in a digital control signal without losing an impedance matching throughout the entire variable range of delay time. The nonlinear circuit 13 produces a first control voltage Vd having a nonlinear property, but the linear circuit 21 may have the above described structure either with or without the provision of the nonlinear circuit 13.

Seventh Embodiment

Figure 13:
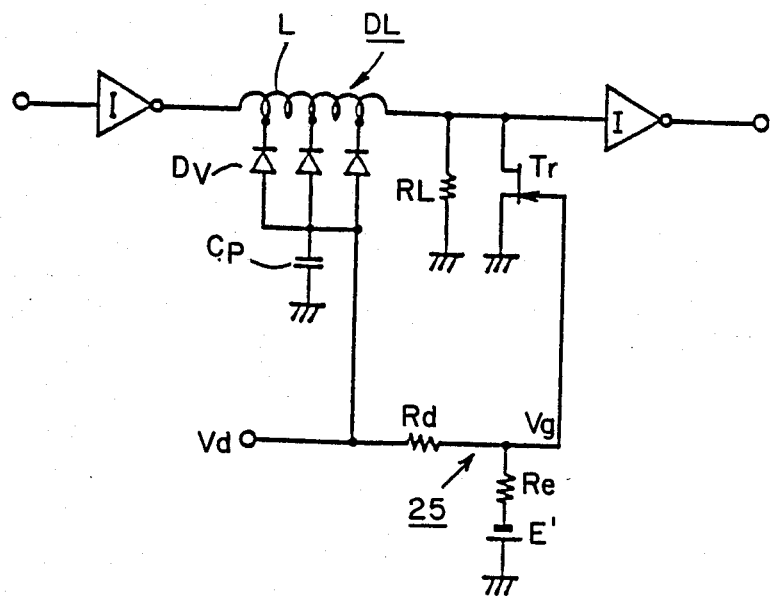

In the delay line shown in FIG. 13, a signal source (not shown in the drawings) is connected to the gate of an FET Tr by way of a resistor Rd and the gate of the FET Tr is grounded by way of a resistor Re and a voltage source E' for level shifting. The resistors Rd and Re and the voltage source E' constitute a linear circuit 25.

In this way, in the variable delay line of the present invention, the linear circuit is not limited to the one which produces a second control voltage Vg from a first control voltage Vd using an operational amplifier, but may also consist of a combination of an attenuation circuit using resistors and a voltage source for level shifting. Since the voltage source E' for level shifting may affect the first control voltage Vd, some measures may be taken on the signal source to prevent this.

It is here understood that a programmable delay line can be built by combining any of the delay lines of the third, the fourth and the seventh embodiment of the present invention as shown in FIG. 1.

Figure 14:
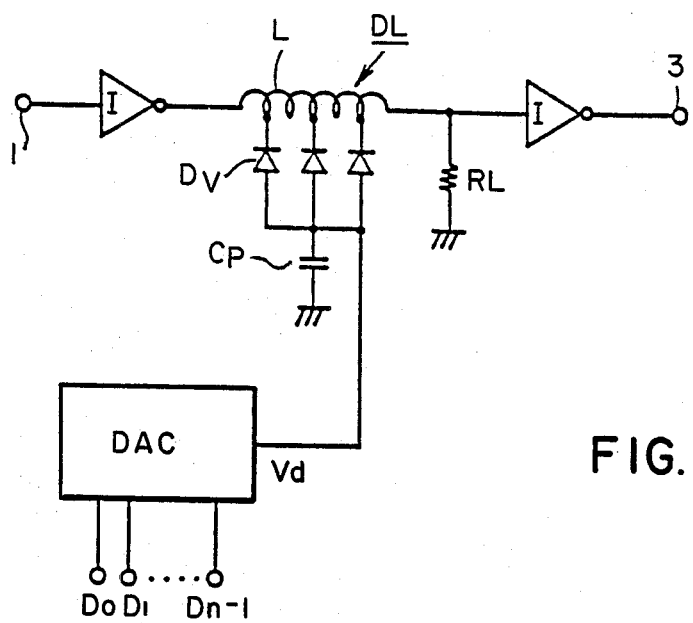
FIG. 14 is a circuit diagram showing a conventional variable delay line.

In the conventional variable delay line shown in FIG. 14, if the inverter I consists of an ECL circuit, a voltage of approximately 0.3 volts is produced across the terminal resistor RL when the signal level of the ECL circuit is "L" and a voltage of approximately 1.1 volts is produced across the terminal resistor RL when the signal level of the ECL circuit is "H", the difference therebetween being approximately 0.8 volts.

On the other hand, a general purpose FET for handling small signals typically involves a voltage of 1.5 volts or less across its drain and source which are used as two terminals of a variable impedance element. Therefore, when an ECL circuit is to be connected to the delay line, a readily available, low-cost FET can be used to build the delay line. The delay line of the present invention is thus suitable for use in combination with an ECL circuit, but may also be used in combination with other digital or analog circuits.

Electronic devices other than FET's can be used to build the delay line according to the present invention as long as they can electronically vary their impedances according to the second control signal applied thereto, but FET's are particularly preferred. The signal source is also not limited to a DC converter but may also be other means which can produce an analog signal which can change in a linear fashion such as a combination of a variable resistor and a DC voltage source. Further, the terminal resistor RL may also be a semi-variable resistor.

What we claim is:

1. An electromagnetic variable delay line system, comprising:
    a delay line consisting of an inductance element having a plurality of taps to which variable capacitance diodes are connected in a ladder;
    a signal source for changing a delay time of the delay line by supplying a first control signal to the variable capacitance diodes;
    electronic impedance varying means which is connected across an output end of the delay line and is adapted to change its impedance in a nonlinear fashion; and
    a nonlinear circuit for producing a second control signal by converting the first control signal for changing the impedance of the electronic impedance varying means according to a change in a characteristic impedance of the delay line.

2. An electromagnetic variable delay line system as defined in claim 1, wherein the first control signal changes in a nonlinear fashion.

3. An electromagnetic variable delay line system as defined in claim 1, wherein the electronic impedance varying means is connected in parallel with a fixed resistor across an output end of the delay line.

4. An electromagnetic variable delay line system as defined in claim 1, wherein the electronic impedance varying means is connected in series with a fixed resistor across an output end of the delay line.

5. An electromagnetic variable delay line system as defined in any one of the preceding claims, wherein the electronic impedance varying means consists of a field effect transistor.

6. An electromagnetic variable delay line system, comprising:
    a delay line consisting of an inductance element having a plurality of taps to which variable capacitance diodes are connected in a ladder;

a signal source for changing a delay time of the delay line by supplying a first control signal to the variable capacitance diodes;

electronic impedance varying means which is connected across an output end of the delay line;

a terminal resistor connected in parallel with the electronic impedance varying means across an output end of the delay line; and a linear circuit for producing a second control signal from the first control signal in a linear fashion for changing the impedance of the electronic impedance varying means according to the change in a characteristic impedance of the delay line;

a resistive value of the terminal resistor being selected in such a manner that a change in a composite impedance of the electronic impedance varying means and the terminal resistor is adapted to a change in the characteristic impedance of the delay line.

7. An electromagnetic variable delay line system as defined in claim 6, wherein the linear circuit comprises a level shift circuit.

8. An electromagnetic variable delay line system as defined in claim 6, wherein the first control signal changes in a nonlinear fashion.

9. An electromagnetic variable delay line system as defined in any one of claims 6 through 8, wherein the electronic impedance varying means consists of a field effect transistor.

* * * * *